(12) United States Patent
Kumashiro

(10) Patent No.: US 6,553,340 B1
(45) Date of Patent: Apr. 22, 2003

(54) COMPUTER SIMULATION METHOD FOR SEMICONDUCTOR DEVICE

(75) Inventor: Shigetaka Kumashiro, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 356 days.

(21) Appl. No.: 09/686,970

(22) Filed: Oct. 12, 2000

Related U.S. Application Data

(63) Continuation of application No. 09/108,406, filed on Jul. 1, 1998, now abandoned.

(30) Foreign Application Priority Data

Jul. 7, 1997 (JP) .............................................. 9-181234

(51) Int. Cl.$^7$ .............................................. G06F 17/50
(52) U.S. Cl. .................................. 703/14; 703/2; 703/4
(58) Field of Search .................... 703/2, 4, 13–22; 716/4–6

(56) References Cited

U.S. PATENT DOCUMENTS

| | | | |
|---|---|---|---|
| 5,467,291 A | 11/1995 | Fan et al. ...................... | 703/14 |
| 5,663,890 A | 9/1997 | Saleh et al. .................... | 703/4 |

OTHER PUBLICATIONS

S. Chung, "Simulation Techniques for VLSI Circuits", ASIC Seminar and Exhibit, 1990 Proceedings, Third Annual IEEE, pp. T–8.1—T–8.6.

H. Park et al., "A Non–Quasi–Static MOSFET Model for SPICE—AC Analysis", IEEE Transactions on Computer–Aided Design, vol. 11, No. 10, Oct. 1992, pp. 1247–1257.

S. Laux, "Techniques for Small–Signal Analysis of Semiconductor Devices", IEEE Transactions on Electron Devices, vol. ED–32, No. 10, Oct. 1985, pp. 2028–2037.

"Techniques for Process Device Simulation", Mar. 30, 1988, Japan, pp. 91–134.

Primary Examiner—Samuel Broda
(74) Attorney, Agent, or Firm—Young & Thompson

(57) ABSTRACT

In a computer simulation method for a semiconductor device, temporal changes in internal physical quantities such as electrostatic potential, electron density, and hole density in a semiconductor device upon application of a pulse voltage are obtained by transient analysis. AC signal analysis is performed by inputting a small RF AC voltage, assuming various physical quantities obtained at each time are in a pseudo steady state. The junction capacitance in the semiconductor device is calculated. These steps are repeatedly performed until a predetermined analysis time is reached to obtain transient temporal changes in junction capacitance.

2 Claims, 4 Drawing Sheets

COMPUTER SIMULATION METHOD FOR SEMICONDUCTOR DEVICE

CROSS-REFERENCE TO RELATED APPLICATIONS

This application is a continuation of copending application Ser. No. 09/108,406, filed Jul. 1, 1998 abandoned.

BACKGROUND OF THE INVENTION

1. Field of the Invention

The present invention relates to a computer simulation method for the electrical characteristics of semiconductor devices and, more particularly, to a numerical simulation method for the transient response characteristics of junction capacitance.

2. Description of the Related Art

According to a conventional computer simulation method for the electrical characteristics of semiconductor devices, as described in Ryo Dan, ed., "Techniques for Process Device Simulations", pp. 91–134, the region to be analyzed is divided into a mesh pattern, and the Poisson equation, electron current continuity equation, and hole current continuity equation are discretized at the respective mesh points. Further, these equations are linearized to obtain simultaneous linear equations by, e.g., the Newton method. These simultaneous linear equations are calculated to obtain solutions.

In addition to this general device simulation, there are methods of calculating PN junction capacitance and Schottky junction capacitance in a device by a numerical simulation, such as small-AC-signal analysis described in, e.g., Section "Sinusoidal Steady-State Analysis ($S_3A$) ", p. 2,032 in Steven E. Laux, "Techniques for Small-Signal Analysis of Semiconductor Devices", IEEE Trans. Electron Devices, Vol. 32, No. 10, pp. 2,028–2,037. This analysis will be explained briefly. In the small-AC-signal analysis, junction capacitance or the like is calculated to obtain a DC solution at a desired operating point. More specifically, equations (1) to (3) below are equivalent to equations (3.41)–(3.43) in "Techniques for Process Device Simulations", pp. 105–106 cited earlier:

$$F(\psi,n,p)=0 \tag{1}$$

$$G(\psi,n,p)=0 \tag{2}$$

$$H(\psi,n,p)=0 \tag{3}$$

where $$F(\psi,n,p)=\nabla(\epsilon\cdot\nabla\psi)+q(p-n+N_D-N_A) \tag{4}$$

$$G(\psi, n, p) = \frac{\partial n}{\partial t} + G_0(\psi, n, p) \tag{5}$$

$$G_0(\psi,n,p)=\nabla(\mu_n n\nabla\psi-D_n\nabla n)-GR(n,p) \tag{6}$$

$$H(\psi, n, p) = \frac{\partial p}{\partial t} + H_0(\psi, n, p) \tag{7}$$

$$H_0(\psi,n,p)=-\nabla(\mu_p p\nabla\psi+D_p\nabla p)-GR(n,p) \tag{8}$$

are solved for $$\frac{\partial n}{\partial t} = 0 \tag{9}$$

$$\frac{\partial p}{\partial t} = 0 \tag{10}$$

to calculate the potential, electron density, and hole density by $$\xi_0=(\psi_0,n_0,p_0) \tag{11}$$

where $\psi$ is the electrostatic potential, n is the electron density, p is the hole density, $\epsilon$ is the permittivity, q is the unit charge, $N_D$ is the donor density, $N_A$ is the acceptor density, $\mu_n$ and $\mu_p$ are the electron and hole mobilities, $D_n$ and $D_p$ are the electron and hole diffusion constants, and GR is the generation/recombination term of an electron/hole. Assume that a small AC bias with an angular frequency $\omega$ and an amplitude $\tilde{V}$ is superposed on a DC bias V at the operating point, and the potential, electron density, and hole density in this state respond in a manner given by $$\xi=\xi_0+\tilde{\xi}\exp j\omega t \tag{12}$$

$$\tilde{\xi}=(\tilde{\psi},\tilde{n},\tilde{p}) \tag{13}$$

Substituting the response in equation (12) into equations (1) to (8) and Taylor-expanding each term using $$\|\tilde{\xi}\|<\|\xi_0\tilde{\xi}\|$$

and $$F(\psi_0,n_0,p_0)=0 \tag{14}$$

$$G_0(\psi_0,n_0,p_0)=0 \tag{15}$$

$$H_0(\psi_0,n_0,p_0)=0 \tag{16}$$

yields equations (17) below equivalent to equation (10) in "Techniques for Small-Signal Analysis of Semiconductor Devices", p. 2,032

$$\begin{pmatrix} \frac{\partial F}{\partial \psi} & \frac{\partial F}{\partial n} & \frac{\partial F}{\partial p} \\ \frac{\partial G_0}{\partial \psi} & j\omega t + \frac{\partial G_0}{\partial n} & \frac{\partial G_0}{\partial p} \\ \frac{\partial H_0}{\partial \psi} & \frac{\partial H_0}{\partial n} & j\omega t + \frac{\partial H_0}{\partial p} \end{pmatrix} \begin{pmatrix} \tilde{\psi} \\ \tilde{n} \\ \tilde{p} \end{pmatrix} = \begin{pmatrix} \tilde{V} \\ 0 \\ 0 \end{pmatrix} \tag{17}$$

By solving equation (17), the complex amplitude $\tilde{\xi}$ of potential, electron density, and hole density is obtained. Assuming that each element of the coefficient matrix is an equivalent conductance, the conductance current component of a response AC current at a device electrode is obtained by the product of the equivalent conductance coupled to the device electrode and defined on a mesh branch, and the complex amplitude across the mesh points on the ends of the branch. By adding the displacement current component $$\varepsilon\frac{\partial(\nabla\phi)}{\partial t}$$

to the conductance current component, the total response AC current $\tilde{I}$ is obtained. Using this, the capacitance component viewed from the device electrode is given by $$C = \frac{\tilde{I}}{\omega \tilde{V}} \quad (18)$$

FIG. 1 is a flow chart showing the processing procedure of this method. In step 301, a DC bias to be applied to a device is set. In step 302, internal physical quantities such as potential, electron density, and hole density at the current operating point are calculated by steady-state analysis. In step 303, the frequency of a small RF voltage to be applied to the device is set. In step 304, a perturbation equation for a small RF AC component is solved to obtain the complex amplitude of a small AC response component of the internal physical quantity. In step 305, the small AC component of an electrode current is calculated from the complex amplitude obtained in step 304, and the junction capacitance viewed from the electrode is calculated using the result. In step 306, whether AC analysis is complete for all frequencies set in advance is checked. In step 307, whether analysis is complete for all DC bias voltages set in advance is checked.

The above description concerns simulation for junction capacitance in a steady state. In addition, there is an experimental method of measuring transient changes in junction capacitance, such as DLTS described in, e.g., Takashi Katoda, ed., "Evaluation Techniques for Semiconductors", pp. 245–247. According to this method, after a step voltage pulse is applied to a device electrode, a small RF voltage of about 1 MHz is applied to the device, and the phase difference with an RF current flowing at that time is continuously observed to measure temporal changes in junction capacitance. No concrete conventional technique has been proposed about this experimental numerical simulation. However, transient changes in capacitance can be numerically simulated by applying the Fourier analysis of transient analysis results which is described in Section "Fourier Decomposition of Transient Excitations (FD)", pp. 2,029–2,030 in Steven E. Laux, "Techniques for Small-Signal Analysis of Semiconductor Devices", IEEE Trans. Electron Devices, Vol. 32, No. 10, pp. 2,028–2,037. More specifically, similar to an actual experiment, an input waveform prepared by superposing a step voltage pulse on a small RF voltage is applied to a device electrode, and transient changes in capacitance are calculated using the transient response current waveform by transient analysis of the device simulation. In transient analysis, an equation describing changes in charged state of a deep impurity level that cause transient changes in junction capacitance is added to equations (1) to (7). These equations are discretized including the time differential terms. The response waveform is divided by time windows using the reciprocal of the frequency of the small RF voltage. Fourier analysis is performed in each window to obtain the average capacitance component in each window. The average capacitance components are combined to obtain final temporal changes in capacitance.

FIG. 2 is a schematic view showing the outline of this method. FIG. 2 schematically shows the case wherein a voltage waveform 402 prepared by superposing a small RF AC voltage on a pulse voltage is directly input and subjected to transient analysis, and a junction capacitance 405 of a device 401 is obtained by Fourier analysis 404 of a response current waveform 403 and the input waveform 402.

The above method of numerically simulating the transient response of capacitance by transient analysis and subsequent Fourier analysis has a problem of a large calculation amount. In general, the transient response time constant of capacitance that is processed by DLTS measurement and the like falls within the range of several msec to several sec. To the contrary, capacitance measurement is generally performed by an RF voltage of 1 MHz. To perform Fourier analysis with satisfactory precision using a time window of about $10^{-6}$ sec, transient analysis must be performed at a time step width of about $10^{-7}$ sec. Therefore, simulating all transient responses requires about $10^4$ to $10^7$ analysis points, resulting in a long calculation time.

SUMMARY OF THE INVENTION.

The present invention has been made to solve the conventional drawbacks, and has as its object to provide a computer simulation method for semiconductor devices in which the transient response of junction capacitance in a semiconductor device can be numerically simulated with a small calculation amount at a high speed.

To achieve the above object, according to the main aspect of the present invention, there is provided a computer simulation method for a semiconductor device, comprising the steps of (a) obtaining, by transient analysis, a temporal change in internal physical quantity including an electrostatic potential, an electron density, and a hole density in a semiconductor device upon application of a pulse voltage, (b) performing AC signal analysis by inputting a small RF AC voltage, assuming various physical quantities obtained at each time are in a pseudo steady state, and (c) calculating junction capacitance in the semiconductor device, the steps (a), (b), and (c) being repeatedly performed until a predetermined analysis time is reached to obtain a transient temporal change in junction capacitance.

According to the method of the present invention, after changes in physical quantities in a device upon application of a pulse voltage are obtained by transient analysis, small-AC-signal analysis is performed assuming the physical quantities are in a pseudo steady state at each analysis time. In the conventional method, a small RF voltage waveform is actually input to perform transient analysis. Accordingly, $10^4$ to $10^7$ analysis points are necessary to obtain a transient response with a time constant of $10^{-3}$ to 1 sec. In the present invention, however, since the capacitance value can be obtained by one AC analysis for each time, the total number of analysis points can be suppressed to such a degree as to express the transient response of capacitance, e.g., to 10 points per transient response time constant, which is two to three orders of magnitude smaller than the conventional case. Assumption of a pseudo steady state in the present invention gives a good approximation as far as the response time constant of junction capacitance is much larger than the reciprocal of the frequency of the small RF voltage, and no problem occurs under normal experimental conditions.

The above and many other objects, features and advantages of the present invention will become manifest to those skilled in the art upon making reference to the following detailed description and accompanying drawings in which preferred embodiments incorporating the principles of the present invention are shown by way of illustrative example.

DETAILED DESCRIPTION OF PREFERRED EMBODIMENTS

Several preferred embodiments of the present invention will be described in detail below with reference to the accompanying drawings.

Figure 1:
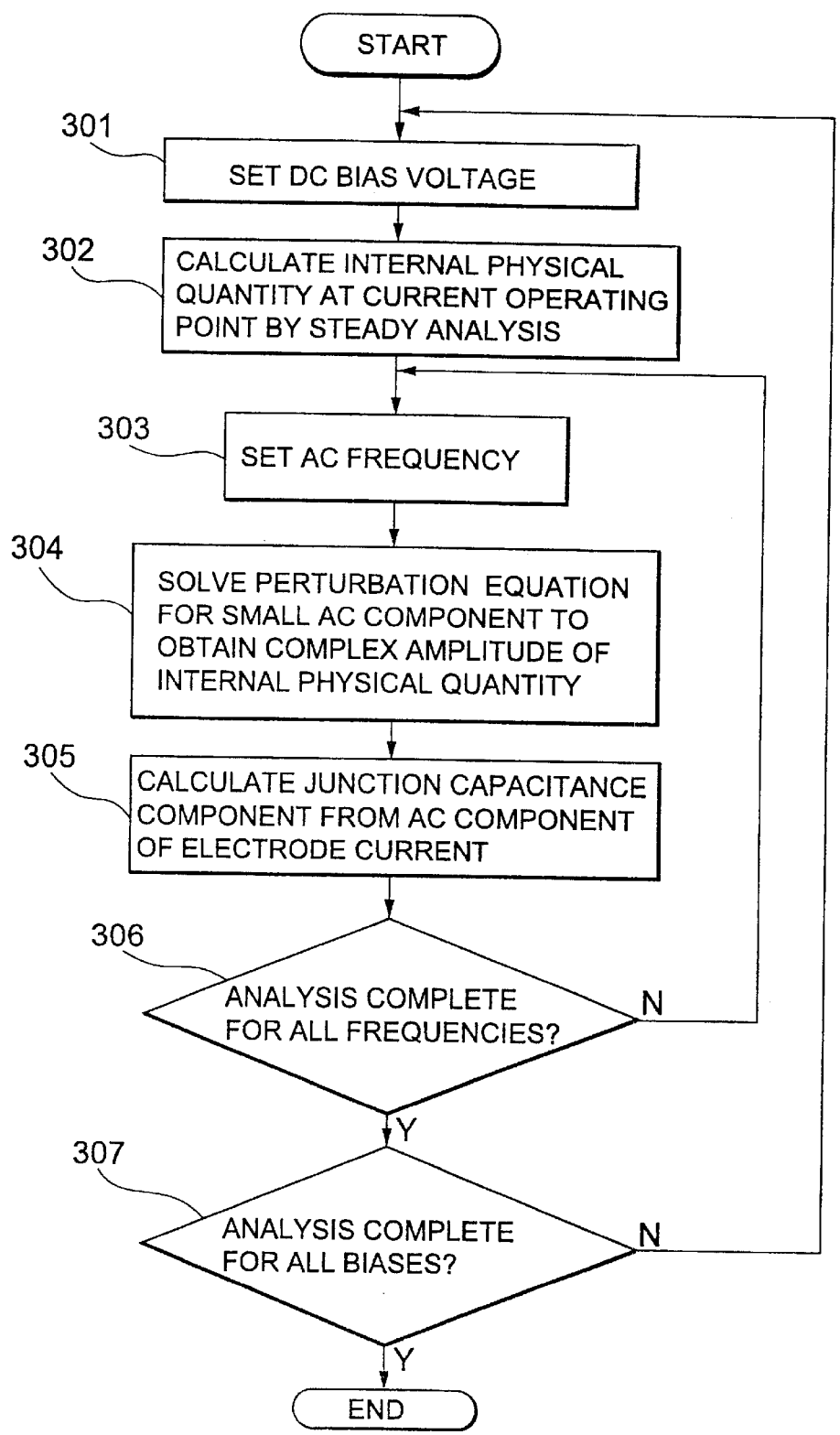
FIG. 1 is a flow chart showing the processing procedure in conventional AC analysis.
Figure 2:
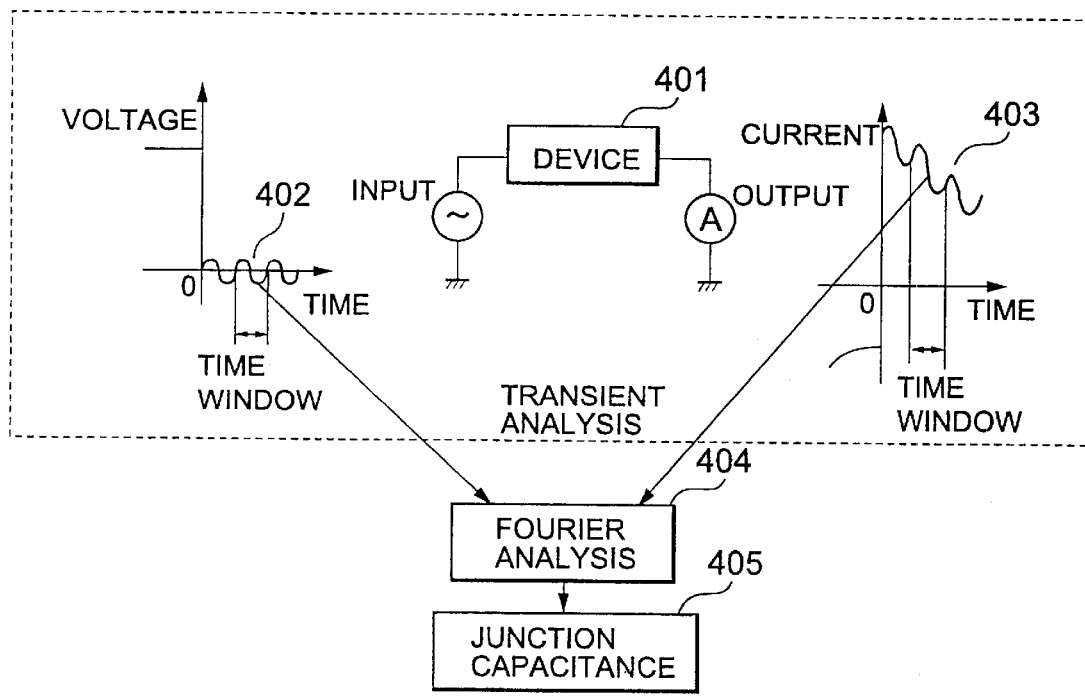
FIG. 2 is a schematic view showing a method of calculating the transient response characteristics of a junction capacitance using the conventional method.
Figure 3:
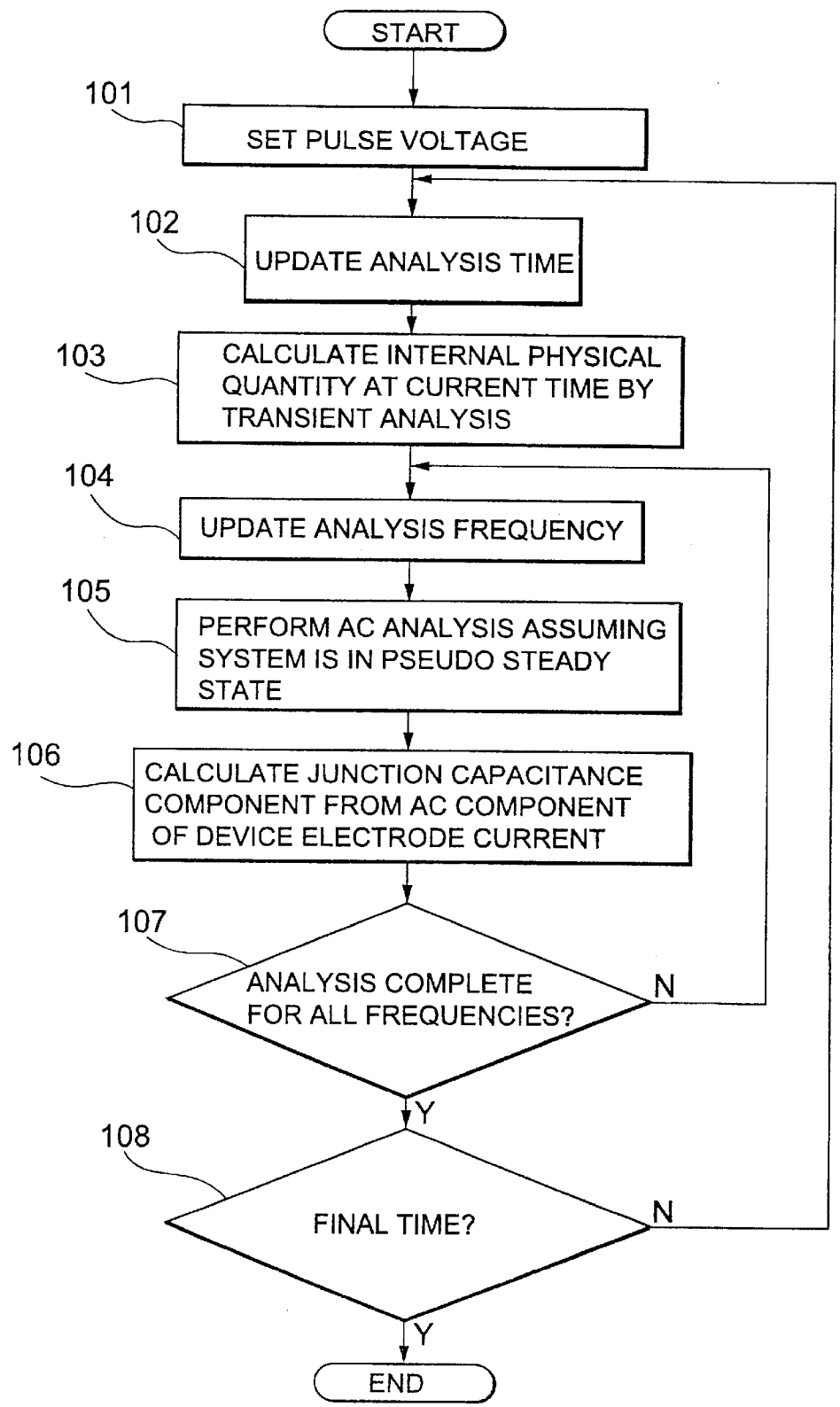
FIG. 3 is a flow chart showing the processing procedure of a computer simulation method for semiconductor devices according to the first embodiment of the present invention.

FIG. 3 is a flow chart showing the processing procedure of a computer simulation method for semiconductor devices according to the first embodiment of the present invention.

In step 101, a pulse voltage to be applied to a device is set. In step 102, the transient analysis time is updated. As described earlier, the time step width is set to a fraction of the transient response time constant of capacitance. In step 103, internal physical quantities such as potential, electron density, and hole density at the current operating point are calculated by transient analysis. In step 104, the frequency of a small RF voltage to be applied to the device is set. In step 105, assuming that the system is in a pseudo steady state, small-AC-signal analysis is performed by inputting a small RF AC voltage, thereby obtaining the complex amplitude of a small AC response component of the internal physical quantity. In step 106, the small AC component of an electrode current is calculated from the complex amplitude obtained in step 105, and the junction capacitance viewed from the electrode is calculated using the result. In step 107, whether AC analysis is complete for all frequencies set in advance is checked. If YES in step 107, the flow advances to step 108; otherwise, to step 104.

In step 108, whether transient analysis is complete is checked. If NO in step 108, the flow returns to step 102; otherwise, the entire processing ends.

In transient analysis of step 103, $$F_{TR}(\psi_i, n_i, p_i, f_i) = 0 \tag{19}$$

$$G_{TR}(\psi_i, n_i, p_i, f_i, n_{i-1}) = 0 \tag{20}$$

$$H_{TR}(\psi_i, n_i, p_i, f_i, p_{i-1}) = 0 \tag{21}$$

$$I_{TR}(n_i, p_i, f_i, f_{i-1}) = 0 \tag{22}$$

where $$F_{TR}(\psi_i, n_i, p_i, f_i) = \nabla(\epsilon \cdot \nabla \psi_i) + q[p_i - n_i + N_D - N_A + N_T(1-f_i)] \tag{23}$$

$$G_{TR}(\psi_i, n_i, p_i, f_i, n_{i-1}) = \frac{n_i - n_{i-1}}{\Delta t} + G_S(\psi_i, n_i, p_i, f_i) \tag{24}$$

$$G_s(\psi_i, n_i, p_i, f_i) = \nabla(\mu_n n_i \nabla \psi_i - D_n \nabla n_i) - GR(n_i, p_i) - N_T[e_n f_i - n_i C_n(1-f_i)] \tag{25}$$

$$H_{TR}(\psi_i, n_i, p_i, f_i, p_{i-1}) = \frac{p_i - p_{i-1}}{\Delta t} + H_S(\psi_i, n_i, p_i, f_i) \tag{26}$$

$$H_s(\psi_i, n_i, p_i, f_i) = -\nabla(\mu_p p_i \nabla \psi_i + D_p \nabla p_i) - GR(n_i, p_i) - N_T[e_p(1-f_i) - p_i C_p f_i] \tag{27}$$

$$I_{TR}(n_i, p_i, f_i, f_{i-1}) = \frac{f_i - f_{i-1}}{\Delta t} + I_S(n_i, p_i, f_i) \tag{28}$$

$$I_s(n_i, p_i, f_i) = e_n f_i - n_i C_n(1-f_i) - e_p(1-f_i) + p_i C_p f_i \tag{29}$$

(where suffix i is the physical quantity at the current time, suffix (i–1) is the physical quantity at the immediately preceding time, $N_T$ is the density of a deep impurity level which causes transient changes in junction capacitance, and f is the electron occupation probability) are solved. The equation I is a rate equation which describes temporal changes in charged state of the deep impurity level, where $e_n$ and $e_p$ are the electron and hole emission rates, and $C_n$ and $C_p$ are the electron and hole trapping coefficients.

In the first embodiment, the entire integration on the time axis is performed using the backward Euler method. Instead, the Crank-Nicholson method or the like can also be employed. In AC analysis of step 105, by solving $$\tilde{\xi} = (\tilde{\psi}, \tilde{n}, \tilde{p})$$

$$\begin{pmatrix} \frac{\partial F}{\partial \psi} & \frac{\partial F}{\partial n} & \frac{\partial F}{\partial p} & \frac{\partial F}{\partial f} \\ \frac{\partial G_S}{\partial \psi} & j\omega t + \frac{\partial G_S}{\partial n} & \frac{\partial G_S}{\partial p} & \frac{\partial G_S}{\partial f} \\ \frac{\partial H_S}{\partial \psi} & \frac{\partial H_S}{\partial n} & j\omega t + \frac{\partial H_S}{\partial p} & \frac{\partial G_S}{\partial f} \\ & \frac{\partial I_S}{\partial n} & \frac{\partial I_S}{\partial p} & j\omega t + \frac{\partial I_S}{\partial f} \end{pmatrix} \begin{pmatrix} \tilde{\psi} \\ \tilde{n} \\ \tilde{p} \\ f \end{pmatrix} = \begin{pmatrix} \tilde{V} \\ 0 \\ 0 \\ 0 \end{pmatrix} \tag{30}$$

the complex amplitude of the internal physical quantity is obtained.

If the frequency of the small AC voltage is too high to follow changes in charged state of the deep impurity level, eliminating the equation for f from equation (30) and solving $$\begin{pmatrix} \frac{\partial F}{\partial \psi} & \frac{\partial F}{\partial n} & \frac{\partial F}{\partial p} \\ \frac{\partial G_S}{\partial \psi} & j\omega t + \frac{\partial G_S}{\partial n} & \frac{\partial G_S}{\partial p} \\ \frac{\partial H_S}{\partial \psi} & \frac{\partial H_S}{\partial n} & j\omega t + \frac{\partial H_S}{\partial p} \end{pmatrix} \begin{pmatrix} \tilde{\psi} \\ \tilde{n} \\ \tilde{p} \end{pmatrix} = \begin{pmatrix} \tilde{V} \\ 0 \\ 0 \end{pmatrix} \tag{31}$$

yields the results we wanted.

Figure 4:
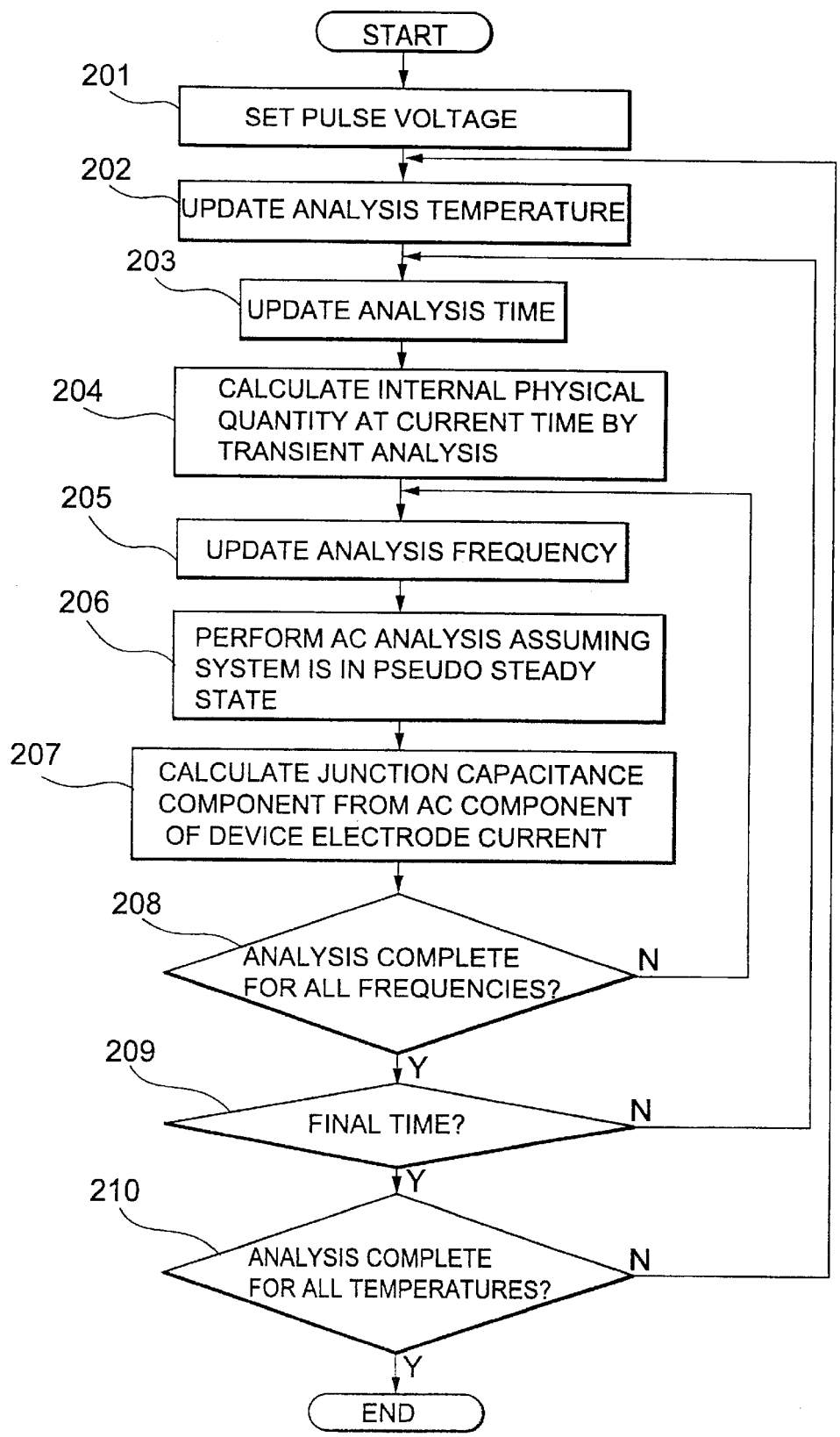
FIG. 4 is a flow chart showing the processing procedure of a computer simulation method for semiconductor devices according to the second embodiment of the present invention.

The second embodiment of the present invention will be described with reference to the accompanying drawings by exemplifying numerical simulation of actual DLTS measurement. FIG. 4 is a flowchart of a transient response simulation method for junction capacitance according to the second embodiment of the present invention.

In step 201, a pulse voltage to be applied to a device is set. In step 202, the analysis temperature is updated. In DLTS, the temperature is swept normally within the range of 77 K to 300 K. In general, since the initial state such as the initial electron occupation probability of a deep impurity level depends on temperature, this loop cannot be set in the time update loop of transient analysis. In step 203, the transient analysis time is updated. In step 204, internal physical quantities such as potential, electron density, and hole density at the current operating point are calculated by transient analysis. In step 205, the frequency of a small RF voltage to be applied to the device is set. In step 206, postulating the system is in a pseudo steady state, small-AC-signal analysis is performed by inputting a small RF AC voltage, thereby obtaining the complex amplitude of a small AC response component of the internal physical quantity. In step 207, the small AC component of an electrode current is calculated from the complex amplitude obtained in step 206, and the junction capacitance viewed from the electrode is calculated using the result. In step 208, whether AC analysis is complete for all frequencies set in advance is checked. If YES in step 208, the flow advances to step 209; otherwise, to step 205. In step 209, whether transient analysis is complete is checked. If NO in step 209, the flow returns to step 203; otherwise, to step 210. In step 210, whether analysis is complete for the entire temperature range set in advance is checked. If NO in step 210, the flow shifts to step 202; otherwise, the entire processing ends.

The capacitance difference between two sampling times is extracted from temporal changes in junction capacitance obtained by the second embodiment. The changes in temperature are used to write a graph to obtain DLTS spectrum calculation values.

What is claimed is:

1. A method of simulating a transient response of junction capacitance in a semiconductor device, comprising the steps of:

determining by transient analysis a temporal change of an internal physical quantity of the semiconductor device upon application of a pulse voltage to the semiconductor device, the internal physical quantity being one of electro-static potential, electron density, and hole density;

determining a complex amplitude of an AC response component of the internal physical quantity by applying an RF voltage to the semiconductor device and conducting small-AC-signal analysis, assuming that the internal physical quantity is in a steady state;

calculating junction capacitance in the semiconductor device from the determined complex amplitude;

repeating the above steps until the transient analysis is complete; and outputting a result that simulates the transient response of junction capacitance of the semiconductor device.

2. The method of claim 1, further comprising the steps of setting a temperature range and determining a transient temporal change in junction capacitance for the temperature range.

* * * * *